(12) United States Patent
Shimokawa et al.

(10) Patent No.: US 7,709,746 B2
(45) Date of Patent: May 4, 2010

(54) PB-FREE SOLDER-CONNECTED STRUCTURE AND ELECTRONIC DEVICE

(75) Inventors: Hanae Shimokawa, Yokohama (JP); Tasao Soga, Fujisawa (JP); Hiroaki Okudaira, Yokohama (JP); Toshiharu Ishida, Fujisawa (JP); Tetsuya Nakatsuka, Yokohama (JP); Yoshiharu Inaba, Tachikawa (JP); Asao Nishimura, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 1093 days.

(21) Appl. No.: 11/331,220

(22) Filed: Jan. 13, 2006

(65) Prior Publication Data

US 2006/0115994 A1 Jun. 1, 2006

Related U.S. Application Data

(62) Division of application No. 09/971,566, filed on Oct. 9, 2001, now Pat. No. 7,013,564, which is a division of application No. 09/581,631, filed as application No. PCT/JP98/05565 on Dec. 9, 1998, now abandoned.

(30) Foreign Application Priority Data

Dec. 16, 1997 (JP) .................................. 9-346811

(51) Int. Cl.
*H05K 1/16* (2006.01)
(52) U.S. Cl. .................. 174/260; 174/261; 361/760
(58) Field of Classification Search ......... 174/260–261; 361/760
See application file for complete search history.

(56) References Cited

U.S. PATENT DOCUMENTS 3,607,253 A 9/1971 Cain et al.
5,039,576 A 8/1991 Wilson
5,320,272 A 6/1994 Melton et al.
5,368,814 A 11/1994 Gonya et al.

(Continued)

FOREIGN PATENT DOCUMENTS

EP 0629467 12/1994

(Continued)

OTHER PUBLICATIONS

Canadian Official Action for Application No. 2,493,351, dated Jul. 20, 2007.

(Continued)

*Primary Examiner*—Jeremy C Norris
(74) *Attorney, Agent, or Firm*—Antonelli, Terry, Stout & Kraus, LLP.

(57) ABSTRACT

Provided are a bonded structure by a lead-free solder and an electronic article comprising the bonded structure. The bonded structure has a stable bonding interface with respect to a change in process of time, an enough strength and resistance to occurrence of whiskers while keeping good wettability of the solder. In the bonded structure, a lead-free Sn—Ag—Bi alloy solder is applied to an electrode through an Sn—Bi alloy layer. The Sn—Bi alloy, preferably, comprises 1 to 20 wt % Bi in order to obtain good wettability of the solder. In order to obtain desirable bonding characteristics having higher reliability in the invention, a copper layer is provided under the Sn—Bi alloy layer thereby obtaining an enough bonding strength.

13 Claims, 10 Drawing Sheets

U.S. PATENT DOCUMENTS

| | | | |
|---|---|---|---|
| 5,540,378 A * | 7/1996 | Mahulikar et al. | 228/180.21 |
| 5,569,433 A | 10/1996 | Chen et al. | |
| 5,759,381 A | 6/1998 | Sakurai et al. | |
| 5,942,185 A | 8/1999 | Nakatsuka et al. | |
| 6,110,608 A * | 8/2000 | Tanimoto et al. | 428/647 |
| 6,176,947 B1 * | 1/2001 | Hwang et al. | 148/400 |
| 6,187,114 B1 | 2/2001 | Ogashiwa et al. | |

FOREIGN PATENT DOCUMENTS

| | | |
|---|---|---|
| EP | 0 715 927 A1 | 6/1996 |
| EP | 0 834 376 | 4/1998 |
| JP | 5-13638 | 1/1993 |
| JP | 8-132277 | 5/1996 |
| JP | 08-224689 | 9/1996 |
| JP | 9-55446 | 2/1997 |
| JP | 09045136 | 2/1997 |
| JP | 09-078285 | 3/1997 |
| JP | 9-266373 | 10/1997 |
| JP | 10-41621 | 2/1998 |
| JP | 10-93004 | 4/1998 |
| JP | 11-001793 | 1/1999 |
| JP | 11251503 | 9/1999 |
| JP | 11330340 | 11/1999 |
| WO | WO 97/00753 | 1/1997 |
| WO | WO 9930866 | 6/1999 |

OTHER PUBLICATIONS

M. Jordan, "Lead-Free Tin Alloys as Substitutes for Tin-Lead Alloy Plating", *Trans IME*, 1997, pp. 149-153.

Fujitsu.48, 4, pp. 305-309, Jul. 1997, "PB-Free Solder".

Office Action of Rejection dated Mar. 25, 2004, in corresponding Japanese patent application.

Korean Official Action, issued Jan. 27, 2006, for Application No. 10-2003-7015770.

European Search Report issued Dec. 7, 2009, for Application No. EP 09 01 3006.

* cited by examiner

FIG. 3
(a)
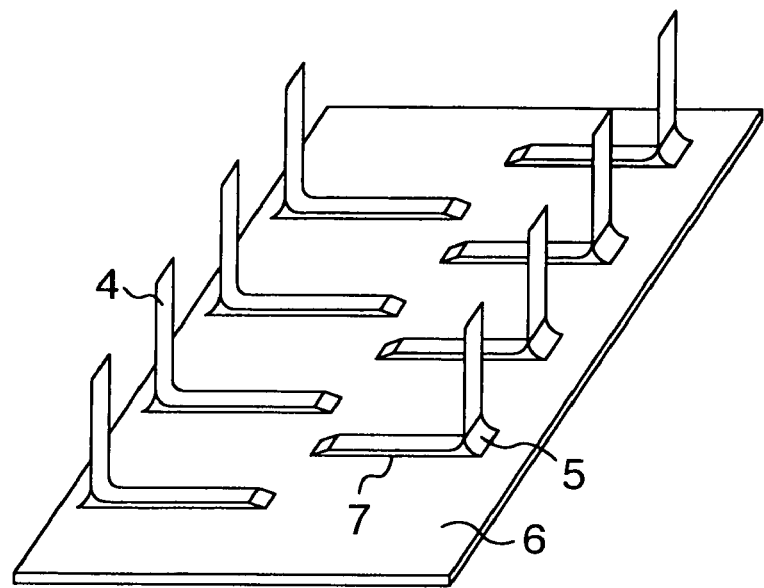
(b)
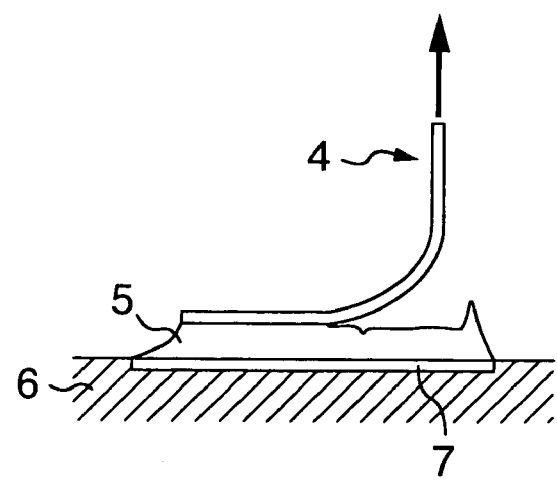

FIG. 9
(a) SECTIONAL VIEW
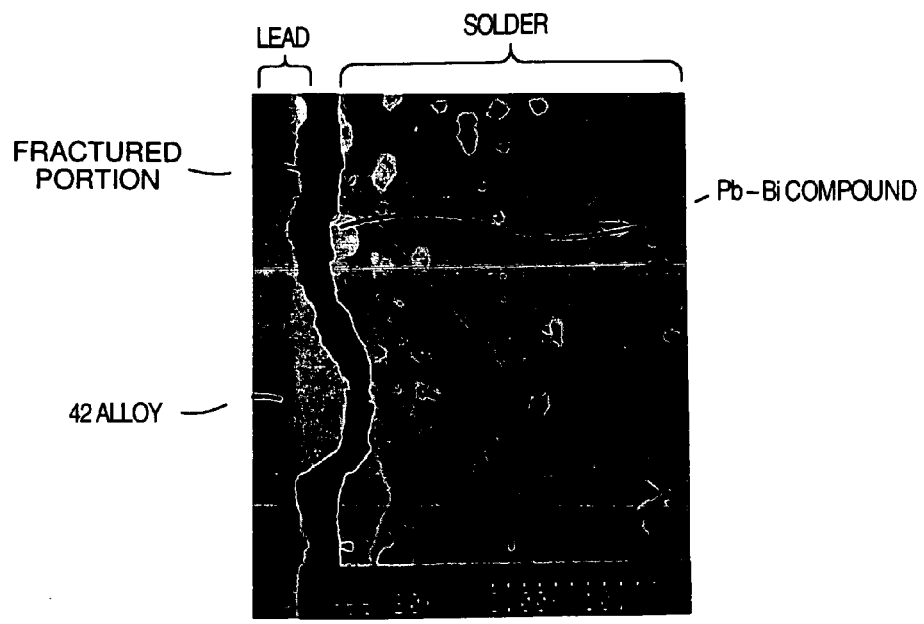
(b) FRACTURED PORTION
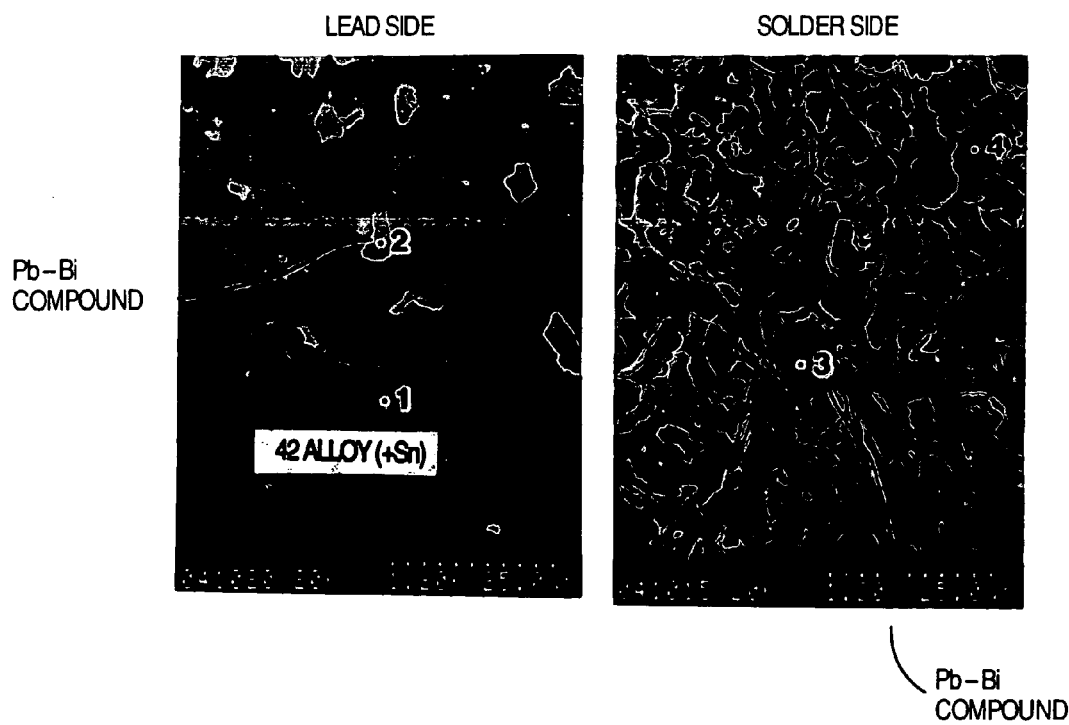

FIG. 10
(a) SECTIONAL VIEW
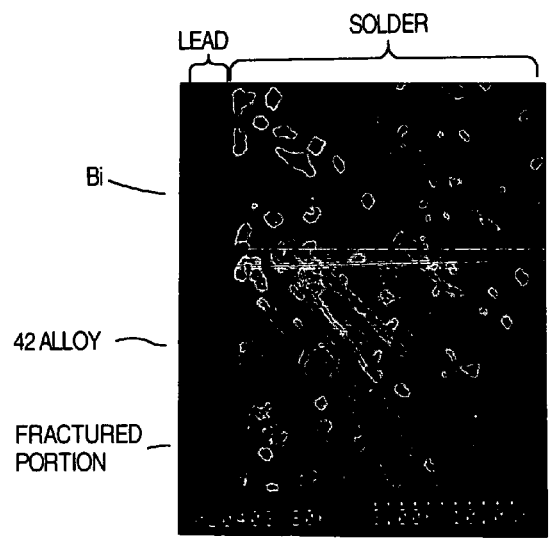
(b) FRACTURED PORTION
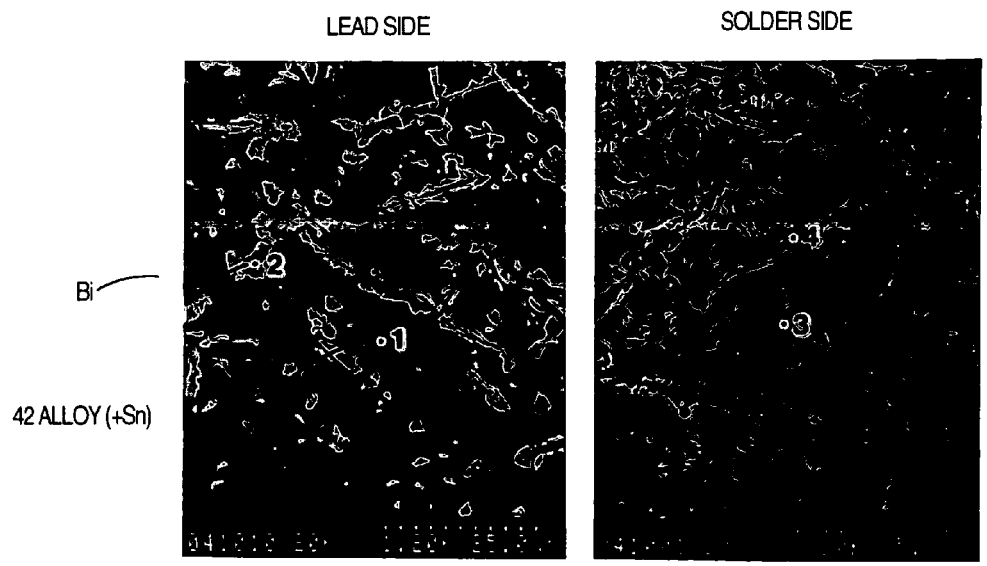

FIG. 11
(a) SECTIONAL VIEW
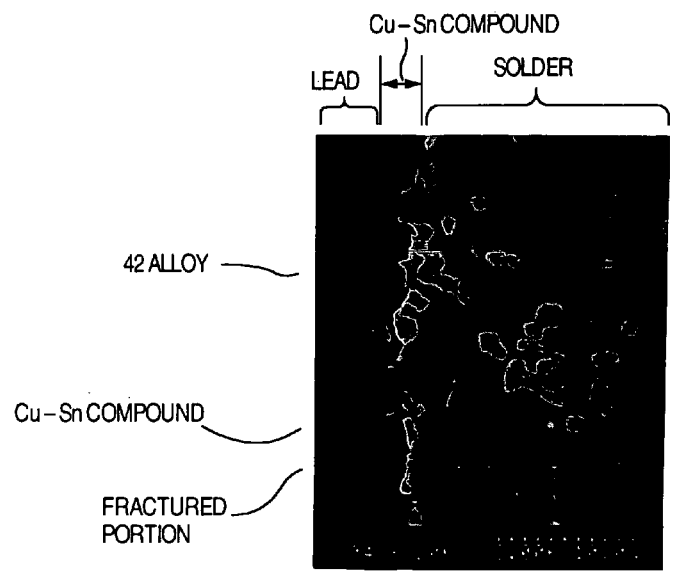
(b) FRACTURED PORTION
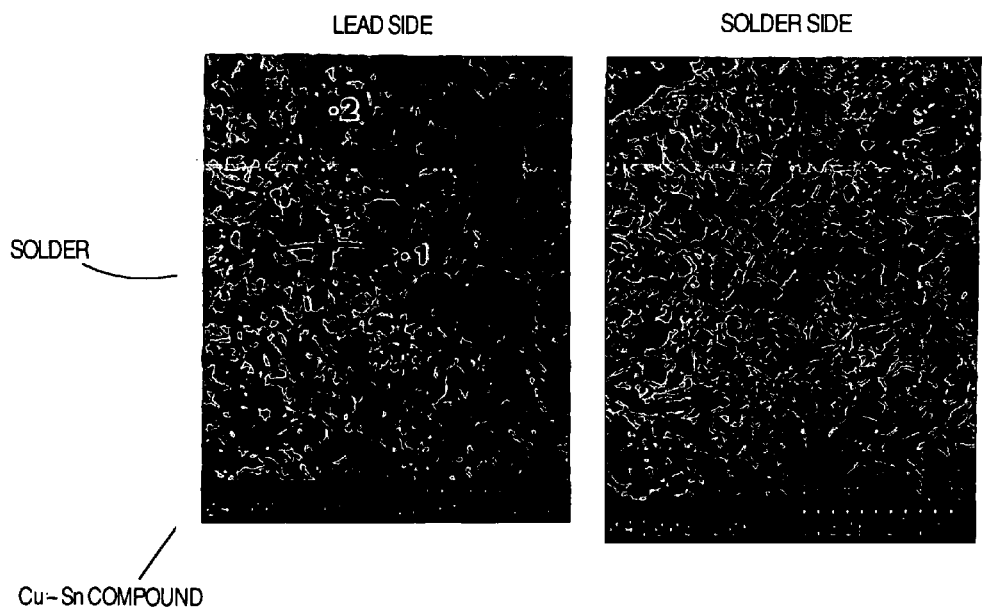

PB-FREE SOLDER-CONNECTED STRUCTURE AND ELECTRONIC DEVICE

This application is a Divisional application of application Ser. No. 09/971,566, filed Oct. 9, 2001, now U.S. Pat. No. 7,013,564 which is a Divisional application of application Ser. No. 09/581,631, filed Jun. 15, 2000, now abandoned, which is a National Stage application under 35 USC 371 of International (PCT) Application No. PCT/JP98/05565, filed Dec. 9, 1998. The contents of Ser. No. 09/581,631 are incorporated herein by reference in their entirety.

TECHNICAL FIELD

The present invention relates to a bonded structure by a lead-free solder, in which an electronic device is bonded to an electrode of a lead frame, etc. by means of the lead-free solder of low toxicity, and an electronic article with the bonded structure.

BACKGROUND ART

In order to produce an electric circuit board by bonding electric devices (e.g. LSIs) to a circuit board made of an organic material, for example, conventionally, there has been used a eutectic Sn—Pb alloy solder, another Sn—Pb alloy solder which has a chemical composition and a melting point each close to that of the eutectic Sn—Pb alloy solder, and other solder alloys which are obtained by adding small amounts of bithmuth (Bi) and/or silver (Ag) to the solders recited above. These solders comprise about 40 wt % Pb and have a melting point of about 183° C., which permit soldering at 220-240° C.

With regard to electrodes of electronic devices, such as QFP (Quad Flat Package)-LSIs, to be soldered, there have been usually used those made of 42 alloy which is an Fe—Ni alloy and on which a layer of 90 wt % Sn-10 wt % Pb alloy (hereinafter referred to "Sn-10Pb") is formed. This is because such electrodes have good wettability, good preservation and no problem of formation of whiskers.

However, the lead (Pb) in the Sn—Pb solders is a heavy metal harmful to humans and pollution of the global environment caused by dumping of lead-containing products and their bad effect on living things have presented problems. The pollution of the global environment by electrical appliances occurs when lead is dissolved by rain, etc. from the dumped lead-containing electrical appliances exposed to sunlight and rain. The dissolution of Pb tends to be accelerated by the recent acid rain. In order to reduce environmental pollution, therefore, it is necessary to use a lead-free soldering material of low toxicity not containing lead as a substitute for the above eutectic Sn—Pb alloy solder which is used in large quantity and to employ a structure of the electrode of a device not containing lead as a substitute material to replace the Sn-10Pb layer provided on the electrode of a device. An Sn—Ag—Bi alloy solder is a promising candidate as a lead-free soldering material in terms of low toxicity, obtainability for raw materials, production cost, wettability, mechanical properties, reliability, etc. Soldering is usually performed at a temperature of about 220-240° C. so as to produce compounds between an electrode of a component and a solder, and between an electrode of a board and a solder. From this, because the bonding interfaces differs from one another depending upon different kinds of combinations of solder materials and electrode materials of components, an electrode material suitable to the respective solder is required in order to obtain a stable bonding interface.

An object of the present invention is to provide a bonded structure by a lead-free-solder, in which a lead free Sn—Ag—Bi alloy solder having low toxicity is used for electrodes of lead frames, etc. and which has a stable bonding interface and an enough bonding strength.

Another object of the invention is to provide an electronic article with utilization of a lead-free Sn—Ag—Bi alloy solder having low toxicity, which has a stable bonding interface with respect to a change in process of time and a strength high enough to withstand stress generated in bonded portions by soldering due to a difference in thermal expansion coefficient between electric devices and a board, a work of dividing the board after soldering, warping of the board during the probing test, handling and so on.

A further object of the invention is to provide a bonded structure and an electronic article with utilization of a lead-free Sn—Ag—Bi alloy solder having low toxicity, which has an enough bonding strength while ensuring resistance to formation of whiskers, wettability of the solder and so on.

DISCLOSURE OF INVENTION

Thus, in order to achieve the objects of the invention, there is provided a bonded structure by a lead-free solder of an Sn—Ag—Bi alloy which is applied to an electrode through an Sn—Bi alloy layer.

In the invention bonded structure with utilization of the lead-free solder, the Sn—Bi alloy layer comprises 1 to 20 wt % Bi.

The invention bonded structure comprises a copper layer between the electrode and the Sn—Bi alloy layer.

In the invention bonded structure, the electrode is made of copper material.

In the invention bonded structure, the electrode is of a lead made of an Fe—Ni alloy or a copper alloy.

In the invention bonded structure, the lead-free Sn—Ag—Bi alloy solder comprises Sn as a primary component, 5 to 25 wt % Bi, 1.5 to 3 wt % Ag and up to 1 wt % Cu.

The invention is also directed to an electronic article which comprises a first electrode formed on an electronic device and a second electrode formed on a circuit board, the both types of electrodes being bonded with each other by a solder, wherein an Sn—Bi alloy layer is formed on the first electrode and the solder is made of a lead-free Sn—Ag—Bi alloy.

In the invention electronic article, the Sn—Bi alloy layer comprises 1 to 20 wt % Bi.

The invention electronic article comprises a copper layer between the first electrode and the Sn—Bi alloy layer.

In the invention electronic article, the first electrode is made of copper material.

In the invention electronic article, the electrode is of a lead made of an Fe—Ni alloy or a copper alloy.

In the invention electronic article, the lead-free Sn—Ag—Bi alloy solder comprises Sn as a primary component, 5 to 25 wt % Bi, 1.5 to 3 wt % Ag and up to 1 wt % Cu.

The invention is also directed to a bonded structure by a lead-free solder, which comprises an electrode, wherein the lead-free solder is of an Sn—Ag—Bi alloy comprising Sn as a primary component, 5 to 25 wt % Bi, 1.5 to 3 wt % Ag and up to 1 wt % Cu, which is applied to the electrode.

As can be understood from the above, according to the present invention, it is possible to ensure a stable bonding interface having an enough bonding strength by applying the lead-free Sn—Ag—Bi alloy solder of low toxicity to an electrode such as a lead frame. With utilization of the lead-free Sn—Ag—Bi alloy solder of low toxicity, it is also possible to ensure a bonding interface which is stable with respect to a change in process of time and which has a high enough strength to withstand stress generated in bonded portions by soldering due to a difference in thermal expansion coefficient between electric devices and a board, a work of dividing the board after soldering, warping of the board during the probing test, handling and so on. Further, with utilization of the lead-free Sn—Ag—Bi alloy solder of low toxicity, it is possible to ensure a bonding interface which has an enough strength and good resistance to occurrence of whiskers by forming sufficient fillets while keeping good wettability at a soldering temperature of, for example, 220-240° C.

BRIEF DESCRIPTION OF DRAWINGS

FIG. 3 schematically shows a testing way of evaluating solder-bonding strength;

FIG. 9 shows an observation result of an interface region of a solder and a lead of an Fe—Ni alloy (i.e. 42 alloy) on which an Sn-10Pb alloy plating is provided according to the prior art, wherein (a) is a cross-sectional view of the interface region, and (b) are fractured surfaces at the lead side and the solder side, respectively;

FIG. 10 shows an observation result of an interface region of a solder and a lead of an Fe—Ni alloy (i.e. 42 alloy) on which an Sn-4Bi alloy plating is provided according to the invention, wherein (a) is a cross-sectional view of the interface region, and (b) are fractured surfaces at the lead side and the solder side, respectively; and FIG. 11 shows an observation result of an interface region of a solder and a lead of an Fe—Ni alloy (i.e. 42 alloy) of the invention on which an under copper layer and an upper Sn-4Bi alloy plating is provided according to the invention, wherein (a) is a cross-sectional view of the interface region, and (b) are fractured surfaces at the lead side and the solder side, respectively.

BEST MODE FOR CARRYING OUT THE INVENTION

Hereinafter, a description of embodiments according to the invention will be provided.

One embodiment of the invention is an electronic article, comprising a first and a second electrodes both of which are bonded with each other by means of a lead-free solder having low toxicity, the first electrode being a QFP lead, a TSOP lead or the like in an electronic device such as a semiconductor device (e.g. LSI), for example, and the second electrode being on a circuit board.

Another embodiment of the invention is a bonded structure comprising a first and a second electrodes both of which are bonded with each other by means of a lead-free solder having low toxicity.

The lead-free solder having low toxicity can be of an Sn—Ag—Bi alloy. With utilization of the Sn—Ag—Bi alloy, it is required to obtain a bonding interface which is stable with respect to a change in process of time and has a bonding strength high enough to withstand stress generated in solder-bonded portions due to a difference in thermal expansion coefficient between an electronic device and a circuit board, a work of dividing the board after soldering, warping of the board during the probing test, handling and so on. It is also required to obtain an enough bonding strength with utilization of the lead-free Sn—Ag—Bi alloy solder by forming a sufficient fillet shape while ensuring enough wettability at 220-240° C., which is a suitable soldering temperature with respect to heat resistance of circuit boards and electronic devices. If the solder has inferior wettability, a sufficient fillet shape can not be obtained resulting in that an enough bonding strength is not obtained or a more active flux is required leading to an adverse influence on insulation resistance. Furthermore, it is also necessary to ensure resistance to formation of whiskers, etc. because short-circuit occurs between electrodes if whiskers are generated and grow on the electrode surface treated by plating, etc.

Figure 1:
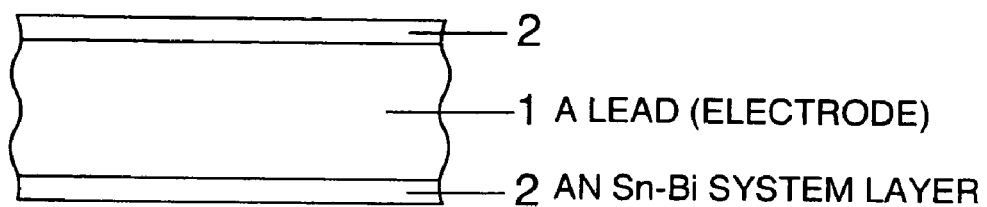
FIG. 1 shows a cross-sectional view of a lead for a QFP-LSI according to the invention.
Figure 2:
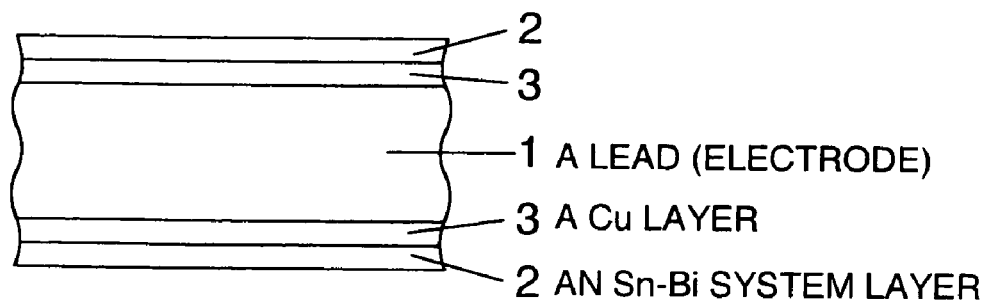
FIG. 2 shows a cross-sectional view of a lead for a TSOP according to the invention.

As shown in FIGS. 1 and 2, an Sn—Bi layer 2 is formed on the surface of an electrode 1 of a lead to obtain enough bonding strength as the electrode structure of the invention. Next, a selection of an electrode structure of the invention will be described. Such selection was made by evaluating mainly bonding strength, wettability and resistance to occurrence whiskers based on the above requirements.

First, the result of an examination of the bonding strength obtained between an Sn—Ag—Bi alloy solder and various kinds of electrode materials are described. An outline of the experiment is illustrated in FIG. 3. Sample leads 4 were formed by plating lead-free materials of Sn, Sn—Bi, Sn—Zn and Sn—Ag alloys, respective which are considered to be usable as alternative materials for the the conventional Sn-10 Pb alloy layer, onto leads each of which is an electrode made of an Fe—Ni alloy (42 alloy). Besides, an evaluation was also performed for combinations with the conventional Sn-10 Pb alloy plating. The respective example lead 4 was 3 mm wide and 38 mm long. It was bent to form right angles so that the length of the soldering section is 22 mm. The plating thickness was approximately 10 µm for each composition. The respective example lead 4 was soldered to a Cu pad (Cu electrode) 7 on a glass epoxy substrate 6, which is a circuit board, with utilization of a lead-free solder 5 of a 82.2 wt % Sn-2.8 wt % Ag-15 wt % Bi alloy (hereinafter referred to as Sn-2.8Ag-15Bi).

The Cu pad (Cu electrode) 7 on the glass epoxy substrate 6 had a size of 3.5 mm×25 mm. The solder 5 was provided in the form of a foil of 0.1 mm×25 mm×3.5 mm. More specifically, the solder foil 5 was placed on the Cu pad 7 on the glass epoxy substrate 6 and the example lead 4 being bent with the right angle was placed on the solder foil 5. Soldering was performed in the air at a maximum temperature of 220° C. after preheating at 140° C. for 60 seconds. A rosin flux containing chlorine was used when soldering. After soldering, cleaning was conducted with an organic solvent. The pull test was conducted in three cases; i.e., a sample lead immediately after soldering, another example lead exposed to a high temperature of 125° C. for 168 hours after soldering taking account of the deterioration of bonding strength due to a change with the passage of time, and a further sample lead after soldering following the exposure thereof to 150° C. for 168 hours to investigate bonding strength in the case where wettability of lead is deteriorated. In the pull test, the example lead was pulled vertically at a rate of 5 mm/minute by gripping its distal end while the substrate is fixed. Then a maximum strength and a generally saturated constant strength were detected as a fillet strength and a flat portion strength, respectively, for the example lead of each composition. The test was conducted ten times for each condition to determine an average value.

Figure 4:
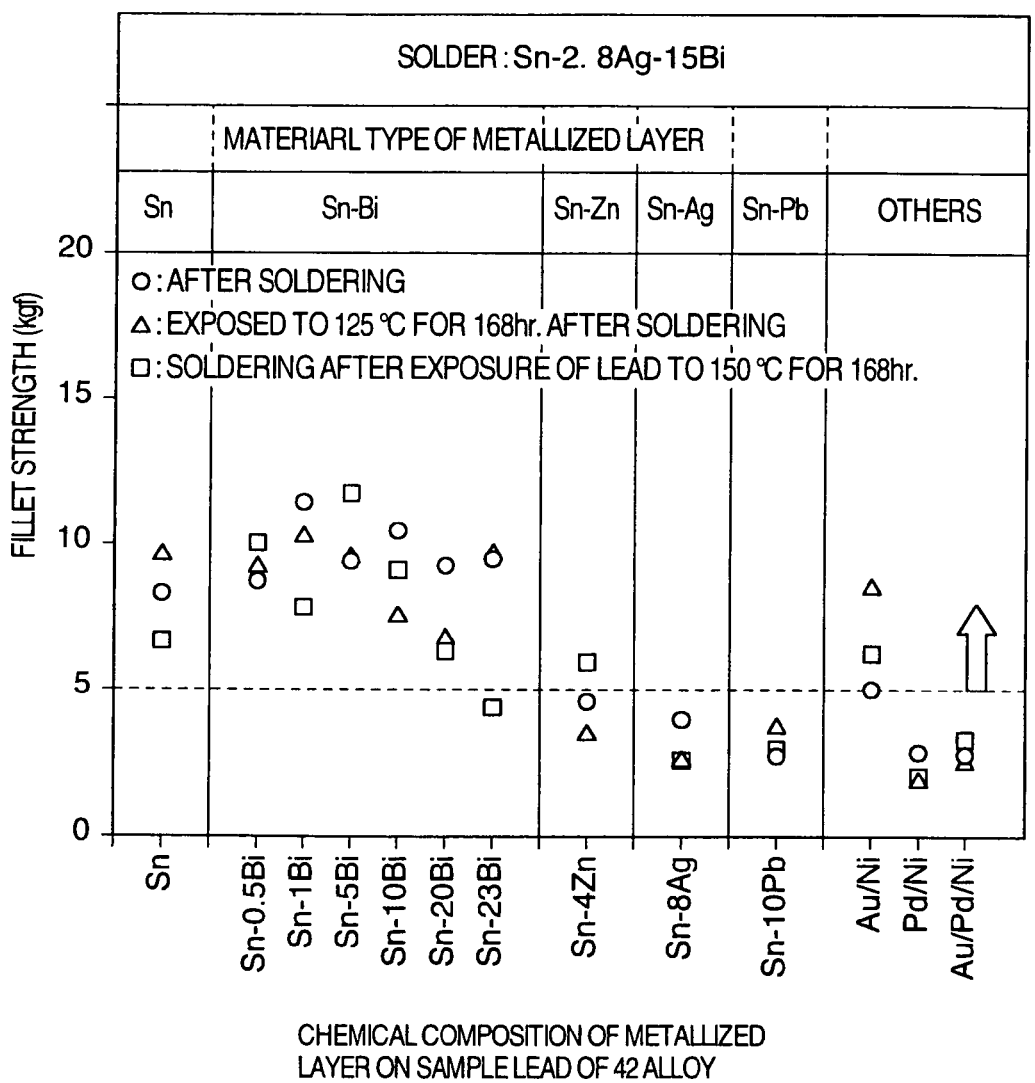
FIG. 4 shows evaluation results of fillet strength with regard to various types of metallized leads according to the invention.

The test results of the fillet strength of the example lead of each composition are shown in FIG. 4. In plastic package devices such as ordinary QFP-LSIs, it is necessary that fillet strength be at least approximately 5 kgf in consideration of a difference in thermal expansion coefficient of printed-circuit board. From this, it became apparent that an adequate bonding interface cannot be obtained in the case of Sn—Zn, Sn—Ag and Sn—Pb alloy layers although fillet strength of not less than 5 kgf was obtained with the example leads in which an Sn layer or Sn—Bi layers other than Sn-23Bi layers containing 23 wt % Bi are plated on the Fe—Ni alloy (42 alloy). In addition to these example leads, further three types of example leads were prepared by providing an Ni plating layer having a thickness of about 2 μm onto the 42 alloy and plating the Ni layer with Au layer, a Pd layer, and a Pd layer with a further Au layer, respectively. Soldering was performed in the same manner and bonding strength was investigated. However, enough fillet strength was incapable of being obtained as shown in FIG. 4. Accordingly, it became apparent that it is necessary to apply an Sn—Bi layer to a lead of an electrode.

Wettability to the Sn-2.8Ag-15Bi solder was tested by the meniscograph method in the Sn—Bi alloy plated leads which showed enough bonding strength in the above pull test conducted on example leads of various compositions. A flux of less activity was used in order to investigate wettability. Test pieces were obtained by cutting the above example leads into a length of 1 cm. The wettability test was conducted under the test conditions: a solder bath temperature of 220° C., an immersion speed of 1 mm/minute, an immersion depth of 2 mm and an immersion time of 20 seconds. The time which elapses till the load recovers to 0 (zero) was regarded as wetting time and the load after immersion for 20 seconds was regarded as wetting force. Wettability was determined in two cases: a lead immediately after plating and a lead exposed to 150° for 168 hours after plating. Measurements were made ten times for each test condition to obtain an average value.

Figure 5:
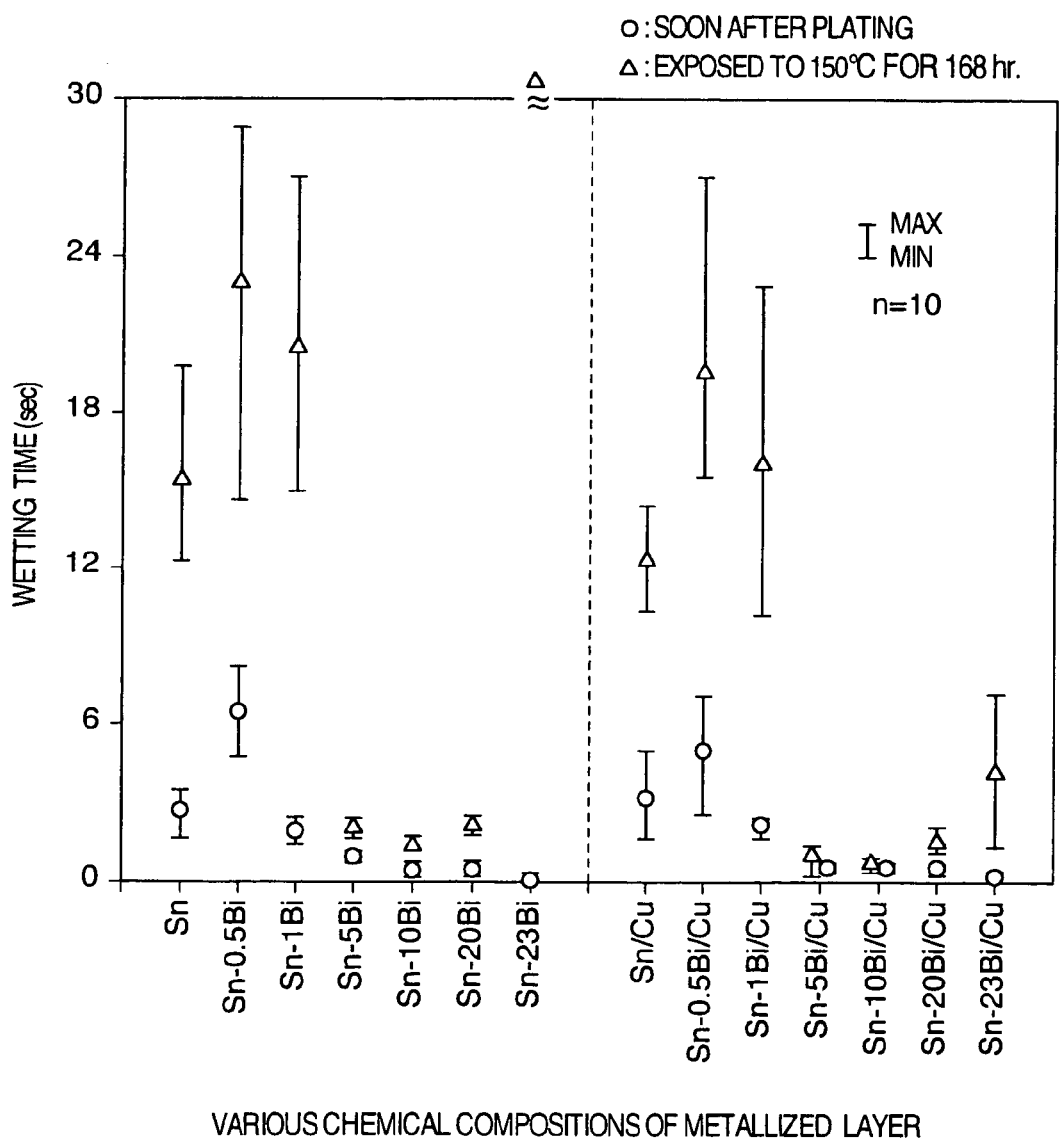
FIG. 5 shows evaluation results of wetting time with regard to various types of metallized leads according to the invention.
Figure 6:
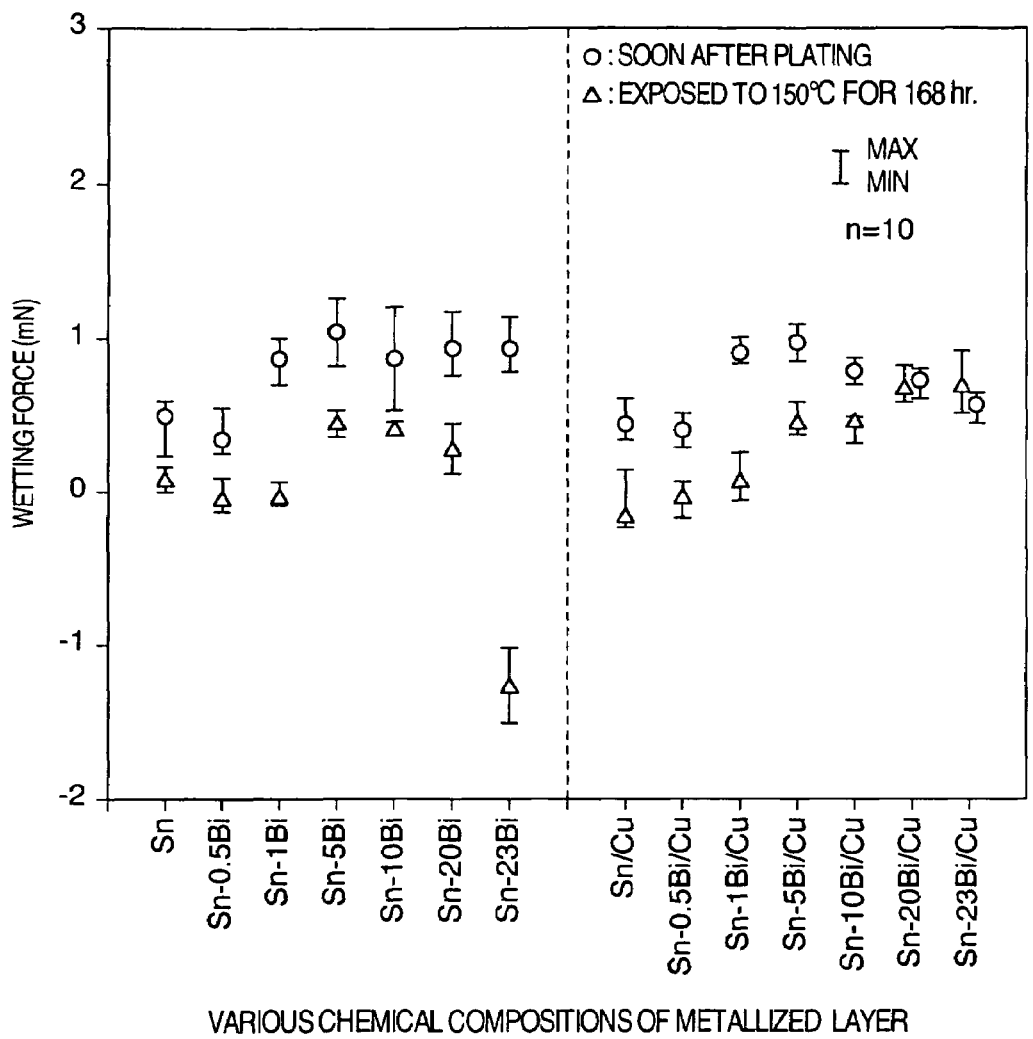
FIG. 6 shows evaluation results of wetting force with regard to various types of metallized leads according to the invention.

The wetting time and wetting force for each composition are shown in FIG. 5 and FIG. 6, respectively. It became apparent from the result of wetting time shown in FIG. 5 that the higher the Bi content, the better wettability in the Sn—Bi alloy plated leads tested immediately after plating, while wettability is deteriorated at below 1 wt % Bi and at 23 wt % Bi when the leads are exposed to a high temperature of 150° for 168 hours. It can be said that at Bi contents of below 1 wt %, wettability was low because the wetting time became long while the wetting force was ensured as shown in FIG. 6. Therefore, it became apparent that a desirable Bi content is from 1 to 20 wt % in order to obtain sufficient wettability even with the Sn—Bi alloy layer.

Figure 7:
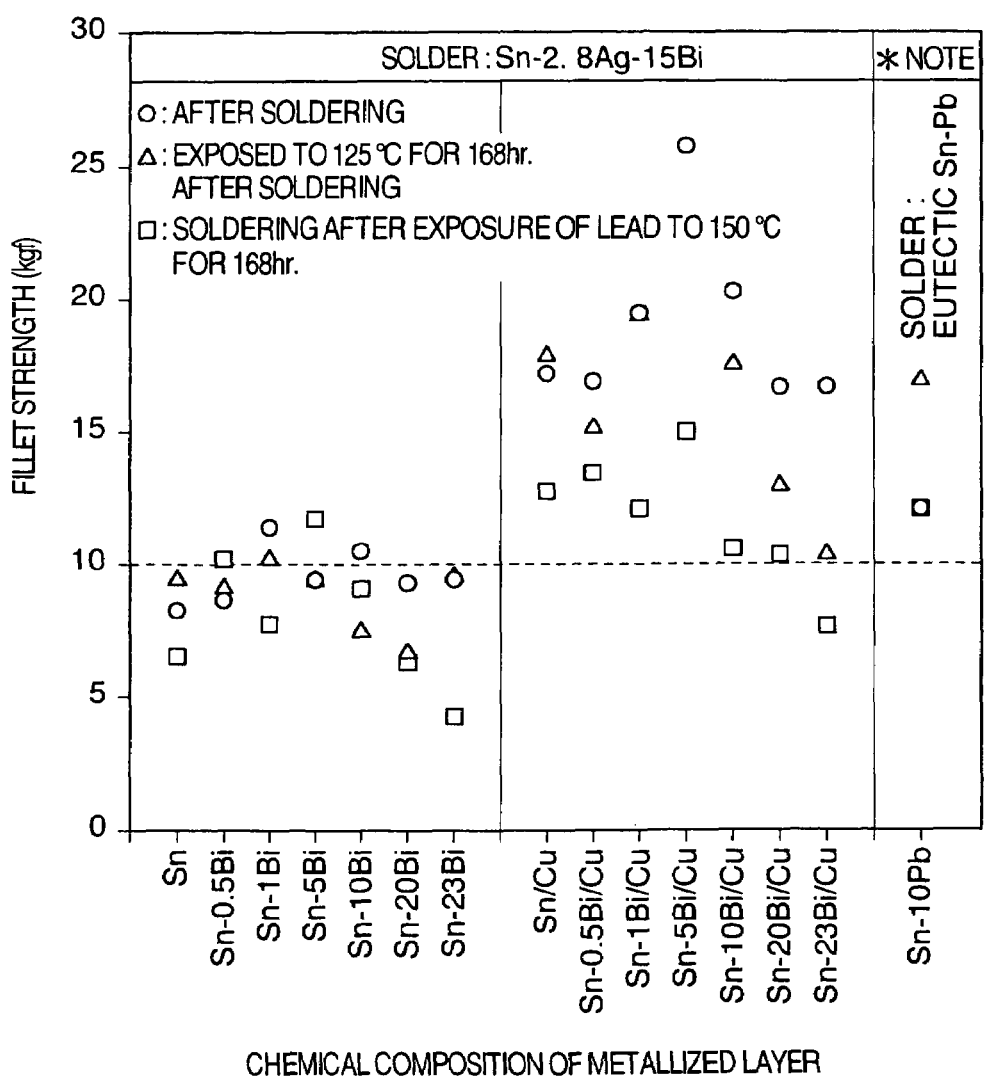
FIG. 7 shows evaluation results of fillet strength in the case where there is formed a copper layer according to the invention.
Figure 8:
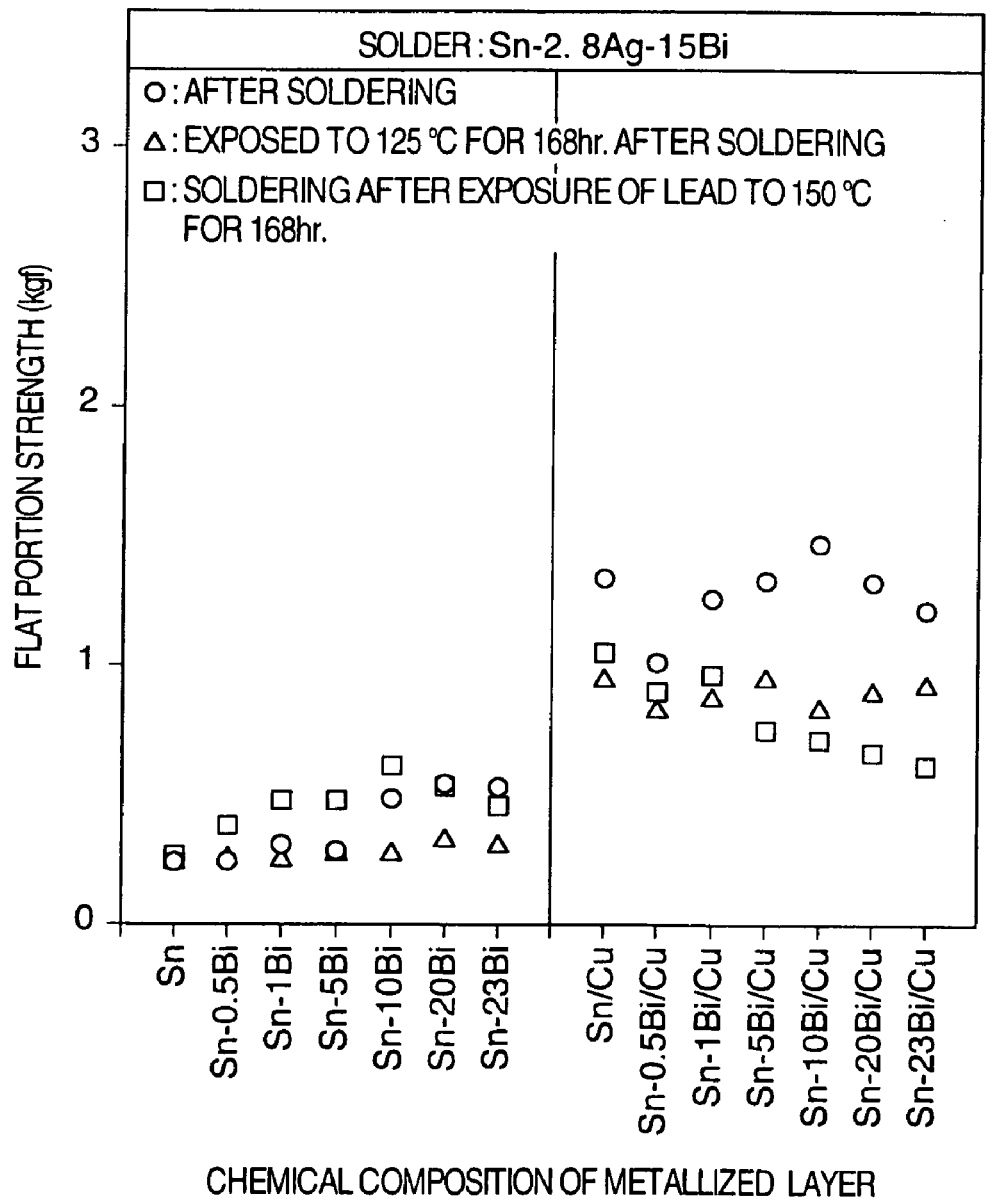
FIG. 8 shows evaluation results of flat portion strength in the case where there is formed a copper layer according to the invention.

Stress generated in the interface is high when materials with a great difference in thermal expansion coefficient are bonded together, when materials are used in an environment of great temperature difference, and the like. The bonding strength in the interface must be approximately 10 kgf or more in order to ensure sufficient reliability. Therefore, it became evident from FIG. 4 that fillet strength of 10 kgf or more cannot be obtained by directly providing an Sn—Bi layer onto the Fe—Ni alloy (42 alloy). It is believed that this is because the compounds at the interface are not sufficiently formed. Therefore, a Cu plating layer of about 7 μm on average was applied to the Fe—Ni alloy (42 alloy) and an Sn—Bi alloy plating layer was applied to this Cu layer in order to raise the reactivity with the solder in the interface and bonding strength was measured. The fillet strength, in the case of no Cu layer, is also shown in FIG. 7. Bonding strength of not less than 10 kgf was obtained with the exception of the case of 23 wt % Bi and the effect of the underlayer of Cu was capable of being verified. By adopting this electrode structure it was possible to obtain a bonding strength of about 12.1 kgf or more that is obtained immediately after soldering of a lead made of the 42 alloy on which an Sn-10Pb alloy layer is formed, which is soldered by means of a eutectic Sn—Pb alloy solder, and whose bonding strength is also shown as a comparative solder in FIG. 7. Furthermore, as shown in FIG. 8, flat portion strength was also capable of being improved by forming a Cu layer under the Sn—Bi alloy layer. The Cu layer may be applied to the 42 alloy as described above when a lead frame of 42 alloy is used. However, when a Cu lead frame is used, this lead frame may be allowed to serve as the Cu layer or a further Cu layer may be formed in order to eliminate the effect of other elements which may sometimes be added to the lead frame material to improve rigidity. The wettability of the example leads to which this Cu layer is applied is also shown in FIGS. 5 and 6. There is scarcely any effect of the Cu layer and sufficient wettability was capable of being obtained at 1-20 wt % Bi, although wettability also deteriorated at Bi contents of not more than 1 wt % when the lead frames were exposed to a high temperature. Incidentally, an Sn-2.8Ag-15Bi was used in the examples shown in FIGS. 7 and 8. However, the formation of an underlayer of Cu is effective in improving bonding strength even in systems of low Bi content, for example, an Sn-2Ag-7.5Bi-0.5Cu alloy.

The method of application of the above Sn—Bi alloy and Cu layers is not limited to plating and these layers can also be formed by dipping, deposition by evaporation, roller coating or metal powder application.

Thus, in order to investigate the reason why various types of the electrode materials have different strengths from one another, cross-sectional surfaces of bonding portions were observed after polishing. Further the fractured surfaces of samples subjected to the pull test were observed under an SEM. The results obtained in the typical combinations are described below.

First, FIG. 9 shows an observation result in the case where a lead obtained by applying an Sn-10Pb alloy plating layer directly onto the conventional Fe—Ni alloy (42 alloy) is bonded using an Sn—Ag—Bi alloy solder. In this combination, Pb—Bi compounds agglomerated at the interface and fracture occurred in the interface between the 42 alloy and the solder. A small amount of Sn was detected on the fractured 42 alloy surface of the lead and it is believed that the Sn in the solder formed compounds with the 42 alloy of lead. It is believed, therefore, that agglomeration of the above compounds of Pb and Bi at the interface reduced the contact area between Sn and 42 alloy, greatly weakening bonding strength.

Next, FIG. 10 shows an observation result in the case where the Sn-10Pb alloy plating layer was replaced with an Sn-4Bi alloy plating layer. The compound layer formed in the interface was thin and fracture occurred similarly at the interface between 42 alloy and solder. However, Bi remained granular crystals, which do not cause a decrease in the area of bond between Sn and 42 alloy so much as in the case of an Sn-10Pb.

It is believed that this is the reason why bonding strength of not less than 5 kgf was capable of being obtained. Auger analysis revealed that the then compound layer is an Sn—Fe layer of about 70 nm.

FIG. 11 shows an observation result in the case where a Cu layer was formed on under the Sn-4Bi layer. It was found that a thick layer of compounds of Cu and Sn is formed in the interface. Fracture occurred in the interface between this compound layer and the solder or in the compound layer. The fractured surface was almost flat in the case shown in FIG. 10 where the Sn—Bi alloy layer was directly formed on the 42 alloy lead, whereas it was uneven in the case where the Cu layer was present. For this reason, it is believed that this difference in the fractured surface resulted in the improvement in bonding strength. Incidentally, similar investigation results were obtained also from other Sn—Ag—Bi alloy solder compositions.

Occurrence of whiskers was investigated for the above example leads of each composition. The formation of whiskers was observed on the surfaces of the example leads to which an Sn—Zn alloy plating layer was applied. It has been hitherto said that Sn plating presents a problem in resistance to the formation of whiskers. However, the occurrence of whiskers was not observed in the Sn—Bi alloy layers and there was no problem in resistance to formation of whiskers.

Accordingly, with the use of the electrode structures of the invention, the bonding portions excellent in bonding strength, wettability and resistance to occurrence of whiskers can be obtained by means of Sn—Ag—Bi alloy solders.

The reason why Sn—Ag—Bi solders containing Sn as a primary component, 5 to 25 wt % Bi, 1.5 to 3 wt % Ag and optionally 0 to 1 wt % Cu were selected is that solders of the composition in these ranges permit soldering at 220-240° C. and that these solders have almost the same wettability as eutectic Sn—Ag alloy solders, which have hitherto been field proven for Cu, and provide sufficient reliability at high temperatures. More specifically, Sn—Ag—Bi alloy solders have a composition (a ternary eutectic alloy) which melt at approximately 138° C. when the Bi content is not less than approximately 10 wt % and it is concerned about that these portions might have an adverse influence on reliability at high temperature. However, the precipitation of a ternary eutectic composition is controlled to levels that pose no problem in practical use and high-temperature strength at 125° C. is also ensured. Accordingly, practical and highly reliable electronic articles can be obtained by soldering the above electrode using the solder of this composition.

EXAMPLE 1

The cross-sectional structure of a lead for QFP-LSI is shown in FIG. 1. This illustrates a part of the cross-sectional structure of the lead. An Sn—Bi alloy layer 2 was formed on a lead 1 which is of an Fe—Ni alloy (42 alloy). The Sn—Bi alloy layer 2 was formed by plating and its thickness was about 10 μm. The Bi content of Sn—Bi alloy plating layer was 8 wt %. The above QFP-LSI having this electrode structure was soldered to a glass epoxy substrate, which is a circuit board, with utilization of an Sn-2.8Ag-15Bi-0.5Cu alloy solder. Soldering was carried out in a reflow furnace of a nitrogen environment at a peak temperature of 220° C. It was possible to obtain bonding portions having sufficient bonding strength. Similarly, a reflow soldering was carried out on a glass epoxy substrate in the air at 240° C. with utilization of an Sn-2Ag-7.5Bi-0.5Cu alloy solder. Bonded portions produced by reflow heating have high reliability especially at a high temperature.

EXAMPLE 2

The cross-sectional structure of a TSOP lead is shown in FIG. 2 which is a part of the lead structure. A Cu layer 3 is formed on a lead 1 which is of an Fe—Ni alloy (42 alloy) and an Sn—Bi alloy layer 2 is formed on this Cu layer. The Sn—Bi alloy layer 3 and Sn—Bi layer 2 were formed by plating. The thickness of the Cu layer 3 was about 8 μm and that of the Sn—Bi plating layer was about 10 μm. The Bi content of Sn—Bi alloy plating layer was 5 wt %. Because of high rigidity of the TSOP lead, when it is used at a high temperature or under a condition that heat generation occurs in the device itself, stress generated at the interface is greater as compared with the QFP-LSI. In such cases, it is necessary to form an interface with sufficient bonding strength high enough to withstand this interface stress and the Cu layer under the Sn—Bi layer is effective for this purpose.

The TSOP was soldered to a printed-circuit board in a vapor reflow furnace with utilization of an Sn—Ag—Bi alloy solder and the thermal cycle test was conducted. The test was conducted under the two test conditions: one hour per cycle of −55° C. for 30 minutes and 125° C. for 30 minutes, and one hour per cycle of 0° C. for 30 minutes and 90° C. for 30 minutes. After 500 cycles and 1,000 cycles the cross section was observed and the condition of formation of cracks was investigated. The cycle test result of crack occurrence was compared with a case where a TSOP of the same size having 42 alloy on which an Sn-10Pb alloy layer is directly formed, was soldered using a eutectic Sn—Pb alloy solder. Although cracks were formed early in the thermal cycles of −55° C./125° C., no problems arose with the thermal cycles of 0° C./90° C. and a bonding interface which is adequate for practical use was obtained.

EXAMPLE 3

The electrode structures according to this invention can also be applied in an electrode on a board. For example, solder coating is effective in improving the solderability of boards. Conventionally, there have been used lead-containing solders such as a eutectic Sn—Pb alloy solder. Thus, the Sn—Bi alloy layer according to the invention can be used to make the solder for coating lead-free. Furthermore, because the electrode of a board is made of copper, sufficient bonding strength can be obtained when an Sn—Ag—Bi alloy solder is used. An example in which this structure is applied is shown; an Sn-8Bi alloy layer of about 5 μm was formed by roller coating on a Cu pad (Cu electrode) on a glass epoxy substrate, which is a circuit board, Wettability to boards and bonding strength were improved, because the solder layer was formed.

INDUSTRIAL APPLICABILITY

An electrode structure can be realized, which is suitable for an Sn—Ag—Bi alloy solder excellent as a lead-free material.

A bonded structure by a lead-free solder can be realized with utilization of a lead-free Sn—Ag—Bi alloy solder, in which an bonding interface which is stable and has sufficient bonding strength can be obtained.

An electronic article can be realized with utilization of a lead-free Sn—Ag—Bi alloy solder of low toxicity, which has a bonded structure by the lead-free solder, which can provide a stable bonding interface with respect to a change in process of time and a strength high enough to withstand stress generated in bonded portions by soldering due to a difference in thermal expansion coefficient between electric devices and a board, a work of dividing the board after soldering, warping of the board during the probing test, handling and so on.

With utilization of a lead-free Sn—Ag—Bi alloy solder of low toxicity, it is possible to obtain sufficient bonding strength by forming adequate fillets while ensuring sufficient wettability, for example, at 220-240° and to ensure resistance to formation of whiskers, etc.

Soldering electronic devices with utilization of an Sn—Ag—Bi solder makes it possible to obtain an interface which has sufficient bonding strength and to ensure wettability which is sufficient for practical use. There is no problem in resistance to formation of whiskers. Thus it is possible to realize lead-free electrical appliances which are environmentally friendly by using the same equipment and process as conventionally.

What is claimed is:

1. An electronic device comprising:
    a substrate; and
    a semiconductor device having a lead on which a single Sn—Bi alloy layer comprising 1 to 5 wt % Bi is provided,
    wherein the substrate and the semiconductor device are connected with each other by utilization of a Pb-free solder, the Pb-free solder being applied to the lead through the single Sn—Bi layer.

2. The electronic device according to claim 1, wherein the Pb-free solder contains Bi.

3. The electronic device according to claim 1, wherein the Pb-free solder is of a Sn—Ag—Bi alloy.

4. The electronic device according to claim 1, wherein the Pb-free solder contains Sn and Ag.

5. The electronic device according to claim 1, wherein the Pb-free solder contains Sn, Ag and Cu.

6. The electronic device according to claim 1, wherein the Pb-free solder contains 5 to 25 wt % Bi, 1.5 to 3 wt % Ag and not less than 1 wt % Cu.

7. The electronic device according to claim 1, wherein material of the lead is an Fe-Ni alloy.

8. The electronic device according to claim 1, wherein material of the lead is a Cu alloy.

9. The electronic device according to claim 1, wherein the semiconductor device is a Thin Small Outline Package (TSOP).

10. The electronic device according to claim 1, wherein the semiconductor device is a Quad Flat Package (QFP).

11. An electronic device comprising:
    a substrate; and
    a semiconductor device having a lead on which a single Sn—Bi alloy layer comprising 1 to 20 wt % Bi, except for 4 to 15 wt % Bi, is provided,
    wherein the substrate and the semiconductor device are connected with each other by utilization of a Pb-free solder, the Pb-free solder being applied to the lead through the single Sn—Bi alloy layer.

12. An electronic device comprising:
    a substrate; and
    a semiconductor device having a lead on which a single layer is provided, said single layer being a Sn—Bi alloy layer comprising 1 to 20 wt % Bi,
    wherein the substrate and the semiconductor device are connected with each other by utilization of a Pb-free solder, the Pb-free solder being applied to the lead through the single Sn—Bi alloy layer.

13. The electronic device according to claim 12, wherein said Sn—Bi alloy layer comprises 1 to 5 wt % Bi.

* * * * *